United States Patent [19]

Akyuerek

[11] 4,019,671
[45] Apr. 26, 1977

[54] METHOD FOR DIP-SOLDERING SEMICONDUCTOR COMPONENTS

[75] Inventor: Altan Akyuerek, Heppenheim, Germany

[73] Assignee: BBC Brown Boveri & Company Limited, Baden, Switzerland

[22] Filed: Mar. 11, 1976

[21] Appl. No.: 665,762

[30] Foreign Application Priority Data

Mar. 14, 1975 Germany .......................... 2511210

[52] U.S. Cl. .......................... 228/123; 228/180 R; 228/218; 228/259
[51] Int. Cl.² ........................................ H01L 21/60
[58] Field of Search ................ 228/123, 36, 40, 42, 228/259, 218, 180, 205

[56] References Cited

FOREIGN PATENTS OR APPLICATIONS 567,286 10/1941 United Kingdom ................ 228/42

Primary Examiner—Al Lawrence Smith
Assistant Examiner—K. J. Ramsey
Attorney, Agent, or Firm—Oblon, Fisher, Spivak, McClelland & Maier

[57] ABSTRACT

A method and apparatus for dip-soldering semiconductor components is disclosed as including a temperature-controlled solder bath and a gas supply line disposed along one edge of the upper surface of the bath. Hydrogen and nitrogen gases are selectively supplied and discharged from nozzles of the supply line by means of a two-way control valve, and the supply line is vertically, horizontally, and rotatably adjustable with respect to the bath container and the bath surface so as to precisely locate the position of the gas nozzles with respect thereto.

2 Claims, 1 Drawing Figure

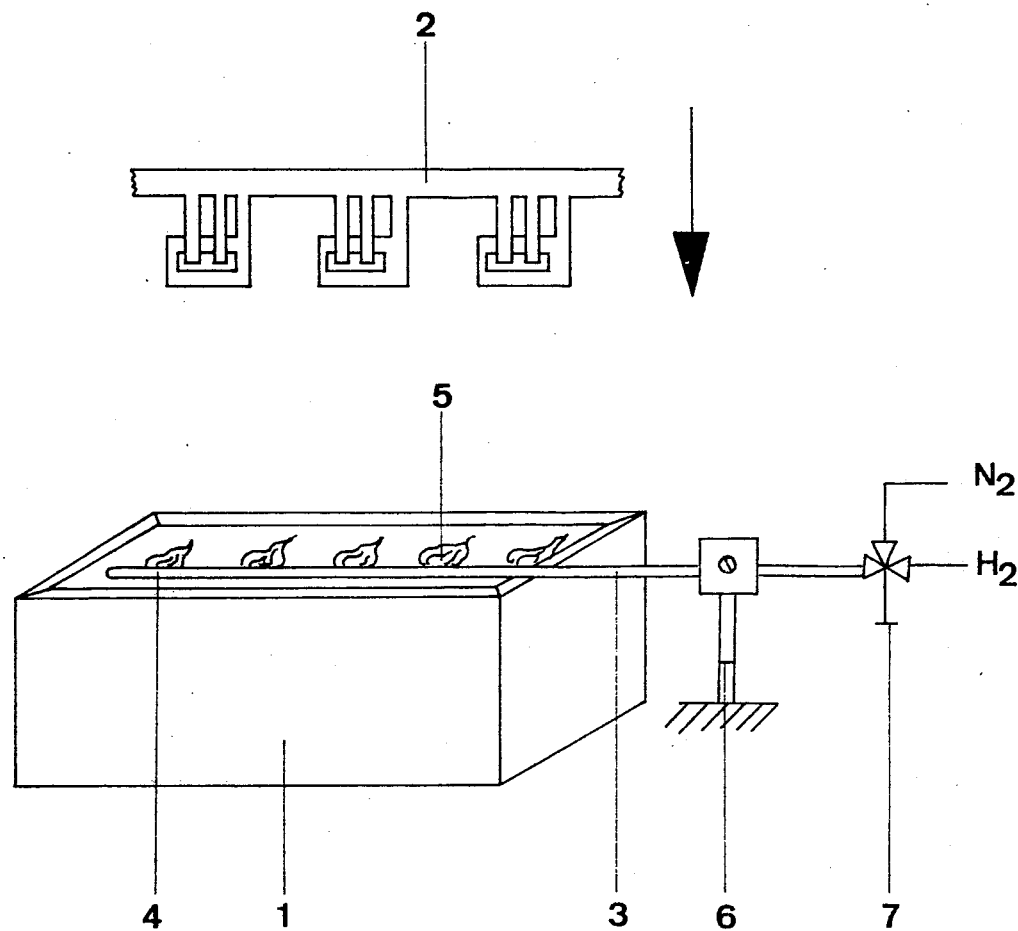

METHOD FOR DIP-SOLDERING SEMICONDUCTOR COMPONENTS

BACKGROUND OF THE INVENTION

1. Field of the Invention

The present invention generally relates to a method and apparatus for dip-soldering semiconductor components, and more particularly to a method and apparatus for dip-soldering semiconductor components mass produced with the use of comb elements.

2. Description of the Prior Art

Within the mass-production of semiconductor components, it is generally known how to mount the components upon comb elements which are then dip-soldered for the purpose of connecting contact elements thereof. The usual procedure is to dip the combs, along with the attached semiconductor chips, into a flux and subsequently into a hot solder bath. Upon removal of the same from the bath, the elements must have any residual flux and dirt thoroughly cleaned and removed from their surfaces. However, it has been experienced that the residual flux can never in fact be completely removed from the soldered elements, and such contaminants are often the cause of subsequent failure of the soldered and encapsulated components.

SUMMARY OF THE INVENTION

Accordingly, the primary object of the present invention is, proceeding upon the basis of the prior art method discussed hereinabove, to render the dip-soldering process more economical, and to simultaneously achieve improved surface wetting, a good reduction process, and improved intermetallic bonding.

The foregoing and other objects are achieved in accordance with the present invention by dipping the semi-conductor components, and contact elements, into a solder bath in a flux-free condition and with their surfaces uniformly enveloped within a hydrogen gas flame. For reasons of safety, and in order to clean the surface of the solder bath, it is also advisable to flush the hydrogen supply line and nozzle with nitrogen gas. Use of the flux-free soldering process of the present invention results in a considerable savings in time, flux and final cleaning processing. Contamination by means of the flux is effectively avoided, and the semiconductor components and comb elements soldered by means of the method of the present invention are very clean, sufficiently wetted, and oxide-free.

The present invention also aims at providing apparatus for carrying out the method noted hereinabove and for permitting the establishment of uniform soldering conditions. The solution to this problem, proceeding upon the basis of a temperature-controlled solder bath, is to use a steel pipe as the supply line for the nitrogen and hydrogen gases which is adjustable horizontally and vertically, and is additionally supported, by suitable means, so as to be rotatable about its axis. The pipe is further provided with a plurality of regularly spaced co-planar exit holes or nozzles disposed along one edge of the solder-bath surface, and the supply of the gases conducted to the pipe is regulated by means of a two-way valve interposed between the pipe and the gas supply sources. It is thus seen that the movement of the pipe with three degrees of freedom is provided in order to facilitate the precise location or the positioning of the gas nozzles with respect to the bath container and the bath surface.

BRIEF DESCRIPTION OF THE DRAWINGS

Various other objects, features, and attendant advantages of the present invention will more fully appreciated as the same becomes better understood from the detailed description when considered in connection with the accompanying drawings, wherein:

The sole FIGURE is a schematic view of an embodiment of the dip-soldering apparatus constructed in accordance with the present invention and showing its cooperative parts, such apparatus also serving to carry out the method of the present invention.

DETAILED DESCRIPTION OF A PREFERRED EMBODIMENT

Referring now to the drawings, the apparatus of the present invention includes a solder bath container 1, a comb 2, with semiconductor chips mounted thereon, initially disposed above container 1, and a steel pipe 3 supported in over-lying fashion upon the upper portion of container 1. The steel pipe 3, preferably V2a-pipe, has regularly spaced exit nozzles 4 from which hydrogen gas flames 5 can issue wihtin a substantially horizontal plane, and is supported by means of an adjustable support 6 by means of which pipe 3 can be adjusted horizontally and vertically, as well as be rotated about its axis. Such an adjustment or movement of the pipe 3 with the aforenoted 3° of freedom is provided in order to facilitate the precise location or positioning of the gas nozzles with respect to the bath container and the bath surface. A two-way valve 7 serves to connect pipe 3 to either one of a source of nitrogen or hydrogen gas, or to neither, as desired.

The solder bath is temperature-controlled by means of a thermostat, not shown, so that the solder, whatever its composition up to the eutectic point, is brought to a melted state, and the solder bath nearly fills the tank or container 1. The pipe 3 is disposed along one side of the solder-bath surface, and as the flames 5 issue within a substantially horizontal plane from nozzles 4, the same uniformly sweep over the entire surface of the bath.

After the solder-bath temperature is stabilized at a value predetermined by the materials used, nitrogen gas is allowed to flow through pipe 3 for a time period of approximately 5 minutes, and subsequent to terminating the nitrogen gas flow, the hydrogen gas is conducted through pipe 3 and ignited whereby the hydrogen flames 5 simultaneously issue from nozzles 4, care being taken to distribute the hydrogen flames 5 homogeneously over the entire surface of the bath.

The combs 2, with their semiconductor chips mounted thereon, are then moved vertically downwardly so as to be dipped into the solder bath and are subsequently moved vertically upwardly so as to be withdrawn therefrom after an immersion period of approximately one second. The dipping, tinning and withdrawal should occur within a time period approximatley 1.5–2 seconds in accordance with the quanitity of combs tinned, the surface temperature of the solder bath being maintained at a temperature of approximately 600° C.

Obviously, many modifications and variations of the present invention are possible in light of the above teachings. It is to be understood therefore that within the scope of the appended claims, the present invention may be practiced otherwise than as specifically described herein.

What is claimed as new and desired to be secured by Letters Patent of the United States is:

1. A method of dip-soldering semicondictor components, in particular components mass-produced with the use of comb elements, comprising the steps of:
   homogeneously sweeping the surface of a solder bath with a hydrogen gas flame; and
   dipping said semiconductor components and contact elements, in a flux-free state, into said solder bath.

2. A method as set forth in claim 1, additionally comprising the steps of:
   passing nitrogen gas through the hydrogen gas supply line and exit nozzles; and
   shutting off the nitrogen gas flow prior to igniting the hydrogen gas.

* * * * *